(12) United States Patent
Hwang et al.

(10) Patent No.: US 10,937,520 B2
(45) Date of Patent: Mar. 2, 2021

(54) METHOD OF OPERATING MEMORY DEVICE IN TEST MODE

(71) Applicant: SK hynix Inc., Gyeonggi-do (KR)

(72) Inventors: Gyu Bum Hwang, Chungcheongbuk-do (KR); Hee Young Kim, Chungcheongbuk-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/670,619

(22) Filed: Oct. 31, 2019

(65) Prior Publication Data
US 2021/0005275 A1    Jan. 7, 2021

(30) Foreign Application Priority Data

Jul. 3, 2019 (KR) .......................... 10-2019-0080275

(51) Int. Cl.
| | |
|---|---|
| *G11C 29/00* | (2006.01) |
| *G11C 29/50* | (2006.01) |
| *G11C 16/08* | (2006.01) |
| *G11C 16/34* | (2006.01) |
| *G11C 16/26* | (2006.01) |
| *G11C 16/16* | (2006.01) |

(52) U.S. Cl.
CPC ........ *G11C 29/50004* (2013.01); *G11C 16/08* (2013.01); *G11C 16/16* (2013.01); *G11C 16/26* (2013.01); *G11C 16/3459* (2013.01)

(58) Field of Classification Search
CPC .............. G11C 29/50004; G11C 16/16; G11C 16/3459; G11C 16/08; G11C 16/26

USPC .......................................................... 365/201
See application file for complete search history.

(56) References Cited

U.S. PATENT DOCUMENTS

| | | | | |
|---|---|---|---|---|
| 5,657,284 | A * | 8/1997 | Beffa .................... | G11C 29/34 365/201 |
| 6,314,011 | B1 * | 11/2001 | Keeth ............... | H01L 27/10805 257/E27.085 |
| 2008/0310242 | A1 * | 12/2008 | Tu .......................... | G11C 29/88 365/200 |
| 2017/0025182 | A1 | 1/2017 | Sabde et al. | |

FOREIGN PATENT DOCUMENTS

KR    10-2017-0012462    2/2017

* cited by examiner

*Primary Examiner* — Tha-O H Bui
(74) *Attorney, Agent, or Firm* — IP & T Group LLP

(57) ABSTRACT

The present technology relates to an electronic device. A method of operating a memory device having improved test performance according to the present technology includes setting a plurality of program biases corresponding to a plurality of memory dies, respectively, based on an operation speed of each of the plurality of memory dies, setting a plurality of offsets corresponding to a plurality of word line groups, respectively, based on an operation speed of each of the plurality of word line groups included in a selected block of a selected memory die among the plurality of memory dies, and detecting a defect of a target block of the selected memory die using a plurality of high voltages and a set low voltage determined based on a program bias corresponding to the selected memory die and the plurality of offsets.

20 Claims, 10 Drawing Sheets

| Die# | Speed | FPGM Bias |
|---|---|---|
| Die_5 | Fast | FPGM 1 |
| Die_2, Die_4, Die_6, Die_8 | Normal | FPGM 2 |
| Die_1, Die_3, Die_7, Die_9 | Slow | FPGM 3 |

| WLG# | Speed | Offset |
|---|---|---|
| WLG1 | Slow | Offset 1 |
| WLG2 | Normal | Offset 2 |
| WLG3 | Fast | Offset 3 |

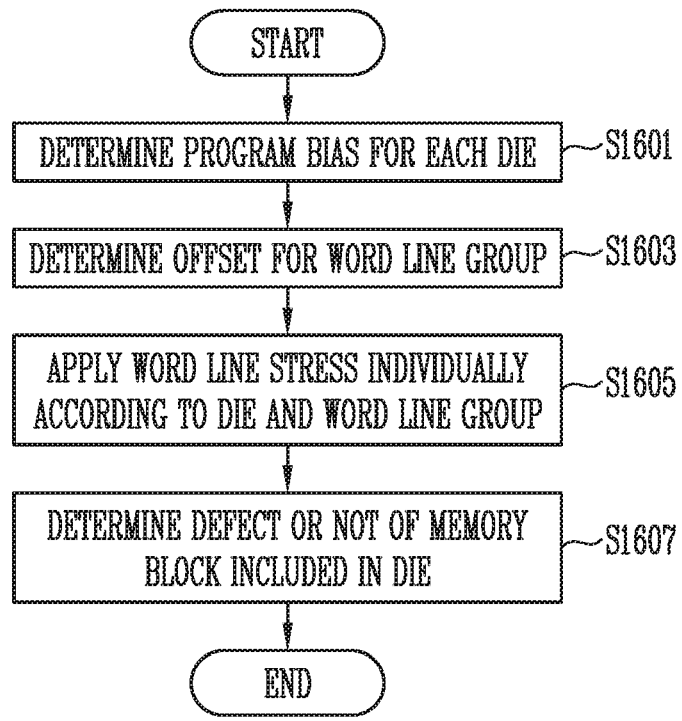

METHOD OF OPERATING MEMORY DEVICE IN TEST MODE

CROSS-REFERENCE TO RELATED APPLICATION

The present application claims priority under 35 U.S.C. § 119(a) to Korean patent application number 10-2019-0080275, filed on Jul. 3, 2019, which is incorporated herein by reference in its entirety.

BACKGROUND

Field of Invention

The present invention disclosure relates to an electronic device, and more particularly, to a method of operating a memory device.

Description of Related Art

A storage device is a device that stores data under control of a host device such as a computer or a smartphone. A storage device may include a memory device in which data is stored and a memory controller controlling the memory device. A memory device may be a volatile or a non-volatile memory device.

A volatile memory device stores data only when power is supplied and loses the stored data when the power supply is cut off. A volatile memory device may include a static random-access memory (SRAM), a dynamic random-access memory (DRAM), and the like.

A non-volatile memory device does not lose data even when power is cut off. A non-volatile memory device may include a read only memory (ROM), a programmable ROM (PROM), an electrically programmable ROM (EPROM), an electrically erasable and programmable ROM (EEPROM), a flash memory, and the like. Consumer demand for improved electronic devices requires continuous improvements in the memory devices employed by these electronic devices.

SUMMARY

An embodiment of the present invention disclosure provides an improved method of operating a memory device which provides improved test performance.

A method of operating a memory device according to an embodiment of the present invention disclosure includes setting a plurality of program biases corresponding to a plurality of memory dies, respectively, based on an operation speed of each of the plurality of memory dies, setting a plurality of offsets corresponding to a plurality of word line groups, respectively, based on an operation speed of each of the plurality of word line groups included in a selected block of a selected memory die among the plurality of memory dies, and detecting a defect of a target block of the selected memory die using a plurality of high voltages and a set low voltage determined based on a program bias corresponding to the selected memory die and the plurality of offsets.

According to the present technology, the method of operating the memory device having improved test performance is provided.

BRIEF DESCRIPTION OF THE DRAWINGS

FIG. 16 is a flowchart of a method for testing a memory device according to an embodiment.

DETAILED DESCRIPTION

Hereinafter, the present invention disclosure will be described in detail with reference to the accompanying drawings.

Figures 1, 2:
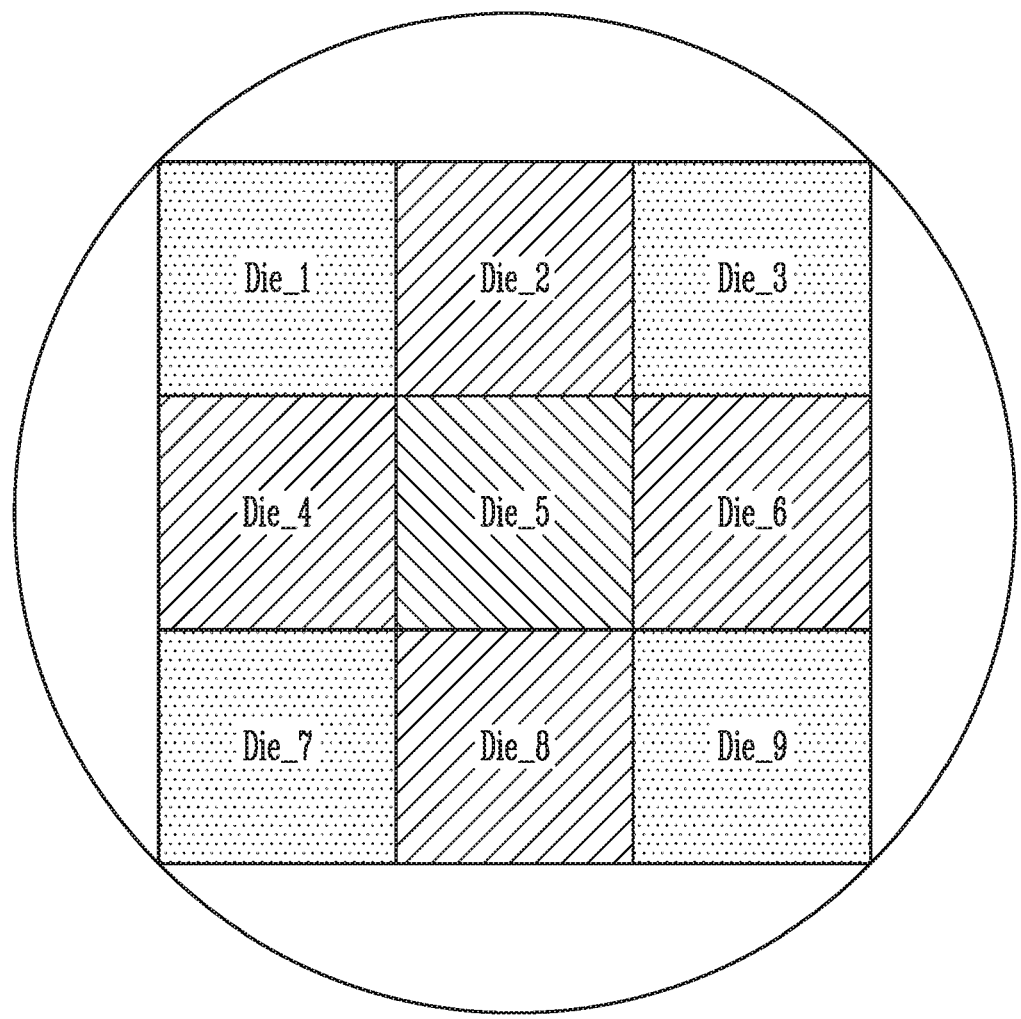
FIG. 1 is a diagram describing a wafer including a plurality of memory dies.
FIG. 2 is a table describing an operation speed and FPGM bias of the memory dies of FIG. 1 according to an embodiment.

FIG. 1 is a diagram describing a wafer including a plurality of memory dies Die_1 to Die_9.

Referring to FIG. 1, the wafer may be a circular semiconductor substrate for manufacturing the plurality of memory dies Die_1 to Die_9. The memory dies to Die_1 to Die_9 formed on the wafer may have different characteristics according to a position.

For example, the closer to a center portion of the wafer, the better the characteristic, and the closer to an edge of the wafer the worse the characteristic. The characteristic may include an operation speed, reliability, lifetime, and the like of a memory device.

In FIG. 1, the dies Die_1 to Die_9 may be formed in a square shape with die Die_5 being at the center of the square and dies Die_1, Die_3, Die_7, and Die_9 positioned at corner edges of the square. Dies Die_4, Die_2, Die_6, and Die_8 are each positioned adjacent to the center die Die_5 each one sharing one common side with the center Die_5 to form a cross shape. The positions of the dies Die_4, Die_2, Die_6, and Die_8 may be referred to as intermediate positions. The positions of the dies Die_1, Die_3, Die_7, and Die_9 may be referred to as corner edge positions or most remote edge positions.

A characteristic of the center memory die Die_5 positioned at the most center portion may therefore be the best, and the characteristics of the memory dies Die_1, Die_3, Die_7, and Die_9 positioned at the most remote edge positions may be worst. Characteristics of memory dies Die_2, Die_4, Die_6, and Die_8 positioned at intermediate positions between the edge and the center portion may be between the best and worst characteristics.

FIG. 1 shows nine memory dies in the wafer as an example. It should be understood that the number of the memory dies included in the wafer may vary by design. Also, the type and the number of characteristics for distinguishing the memory dies are not limited to the ones described as examples in the present embodiment.

FIG. 2 is a table describing the operation speed and flexible program (FPGM) bias of the memory dies of FIG. 1 according to an embodiment.

Referring to FIGS. 1 and 2, the operation speed of the memory die Die_5 having the best characteristic may be the highest which is referred to herein as fast. The operation speeds of the memory dies Die_2, Die_4, Die_6, and Die_8 may be intermediate, also referred to herein as normal. The operation speed of the memory dies Die_1, Die_3, Die_7, and Die_9 having the worst characteristic may be the lowest, also referred to herein as slow.

Each memory die may have a FPGM bias according to its operation speed.

A memory die having a high operation speed may be programmed more quickly when a program operation is performed with the same program bias than a memory die having a normal operation speed. A memory die having a low operation speed may be programmed more slowly when the program operation is performed with the same program bias than a memory die having the normal operation speed.

In order to equalize a program operation speed of each memory die, a program bias applied to a memory die during a program operation may be variously set according to the operation speed of the memory die. The program bias of the memory die may be flexibly determined according to the operation speed of the memory die. For example, the memory die Die_5 having the highest operation speed may have a first program bias FPGM1. The memory dies Die_2, Die_4, Die_6, and Die_8 having the normal operation speed may have a second program bias FPGM2, The memory dies Die_1, Die_3, Die_7, and Die_9 having the lowest operation speed may have a third program bias FPGM3. Since the operation speed and the program bias are inversely proportional, a magnitude of the program bias may increase in the order of the first program bias FPGM 1, the second program bias FPGM 2, and the third program bias FPGM 3.

It is noted that the number of the operation speeds for distinguishing the memory dies and the number of the program biases are not limited to the ones shown in the present embodiment. For example, the number of operation speeds and corresponding program biases may depend upon the number and shape of the dies formed in the wafer. As the number and shape of the dies in the wafer may vary so can the operation speeds. Also, although the shape of the dies of FIG. 1 is square it is noted that the shape may be different. For example, the dies may each have the shape of a rectangle. Other shapes are also possible.

In another embodiment, each memory die may have a flexible erase bias (FERS bias). A value of an erase bias may be determined based on the operation speed of the memory die in the same manner as the program bias described above.

Figure 3:
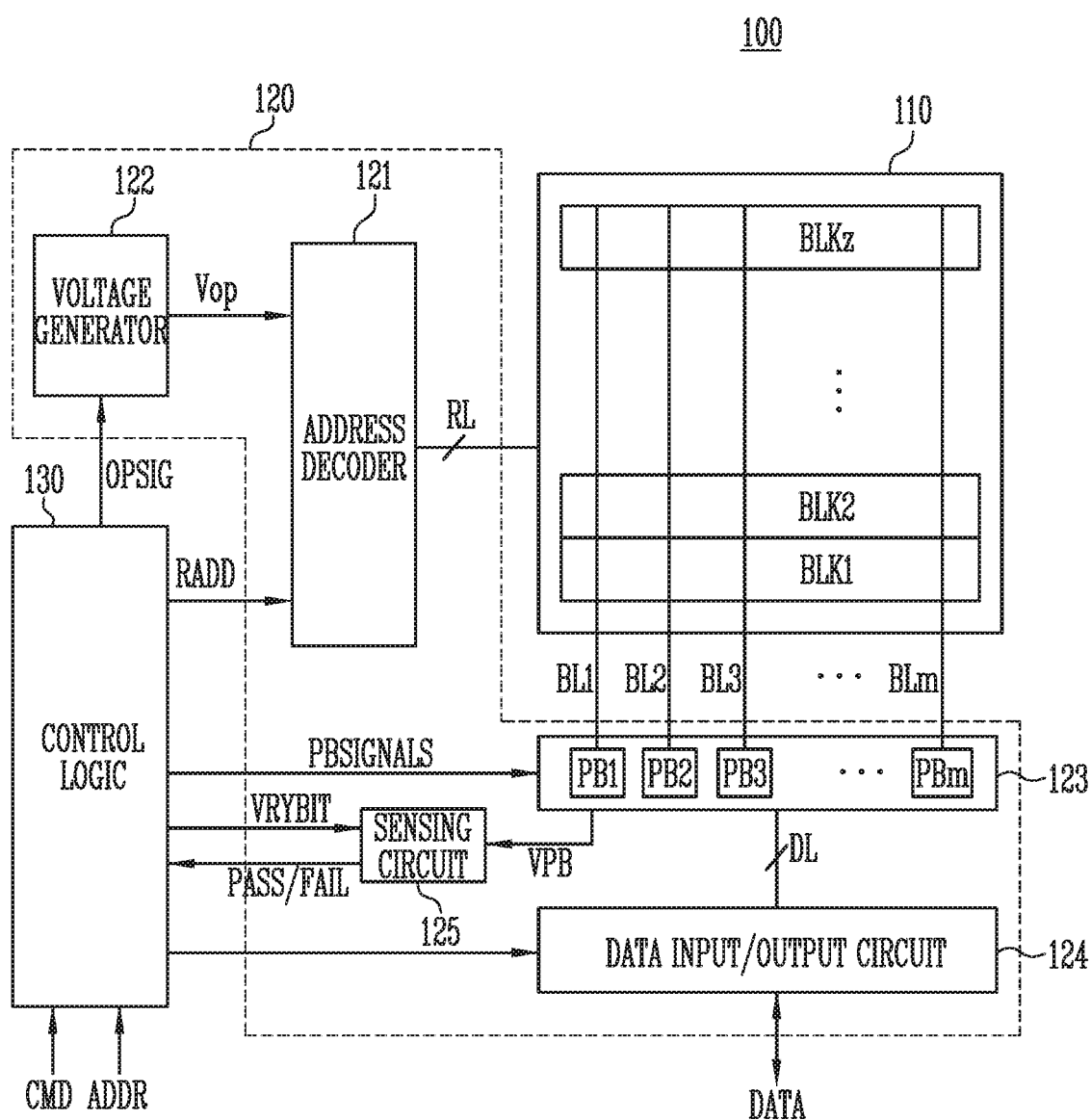
FIG. 3 is a block diagram describing a structure of the memory die of FIG. 1 according to an embodiment.

FIG. 3 is a block diagram describing a structure of the memory die of FIG. 1 according to an embodiment.

Referring to FIG. 3, a memory device 100 may include a memory cell array 110, a peripheral circuit 120, and a control logic 130.

The memory cell array 110 includes a plurality of memory blocks BLK1 to BLKz. The plurality of memory blocks BLK1 to BLKz are connected to an address decoder 121 through row lines RL. The plurality of memory blocks BLK1 to BLKz are connected to a read and write circuit 123 through bit lines BL1 to BLm. Each of the plurality of memory blocks BLK1 to BLKz includes a plurality of memory cells. In an embodiment, the plurality of memory cells are non-volatile memory cells. Memory cells connected to the same word line among the plurality of memory cells are defined as one physical page. That is, the memory cell array 110 is configured of a plurality of physical pages. According to an embodiment of the present invention disclosure, each of the plurality of memory blocks BLK1 to BLKz included in the memory cell array 110 may include a plurality of dummy cells. At least one of the dummy cells may be connected in series between a drain select transistor and the memory cells and between a source select transistor and the memory cells.

Each of the memory cells of the memory device 100 may be configured as a single level cell (SLC) that stores one data bit, a multi-level cell (MLC) that stores two data bits, a triple level cell (TLC) that stores three data bits, or a quad level cell (QLC) that stores four data bits.

The peripheral circuit 120 may include an address decoder 121, a voltage generator 122, the read and write circuit 123, a data input/output circuit 124, and a sensing circuit 125.

The peripheral circuit 120 drives the memory cell array 110. For example, the peripheral circuit 120 may drive the memory cell array 110 to perform a program operation, a read operation, and an erase operation.

The address decoder 121 is connected to the memory cell array 110 through the row lines RL. The row lines RL may include drain select lines, word lines, source select lines, and a common source line. According to an embodiment of the present invention disclosure, the word lines may include normal word lines and dummy word lines. According to an embodiment of the present invention disclosure, the row lines RL may further include a pipe select line.

In an embodiment, the row lines RL may be local lines included in local line groups. The local line group may correspond to one memory block. The local line group may include the drain select line, local word lines, and the source select line.

The address decoder 121 is configured to operate in response to control of the control logic 130. The address decoder 121 receives an address ADDR from the control logic 130.

The address decoder 121 is configured to decode a block address of the received address ADDR. The address decoder 121 selects at least one memory block among the memory blocks BLK1 to BLKz according to the decoded block address. The address decoder 121 is configured to decode a row address RADD of the received address ADDR. The address decoder 121 may select at least one word line of a selected memory block by applying voltages supplied from the voltage generator 122 to at least one word line WL according to the decoded row address RADD.

During the program operation, the address decoder 121 may apply a program voltage to a selected word line and apply a pass voltage having a level less than that of the program voltage to unselected word lines. During a program verify operation, the address decoder 121 may apply a verify voltage to the selected word line and apply a verify pass voltage having a level greater than that of the verify voltage to the unselected word lines.

During the read operation, the address decoder 121 may apply a read voltage to the selected word line and apply a read pass voltage having a level greater than that of the read voltage to the unselected word lines.

According to an embodiment of the present invention disclosure, the erase operation of the memory device 100 is performed in memory block units. The address ADDR input to the memory device 100 during the erase operation includes a block address. The address decoder 121 may decode the block address and select one memory block according to the decoded block address. During the erase operation, the address decoder 121 may apply a ground voltage to the word lines input to the selected memory block.

According to an embodiment of the present invention disclosure, the address decoder 121 may be configured to decode a column address of the transferred address ADDR. The decoded column address may be transferred to the read and write circuit 123. As an example, the address decoder 121 may include a component such as a row decoder, a column decoder, and an address buffer.

The voltage generator 122 is configured to generate a plurality of operation voltages Vop by using an external power voltage supplied to the memory device 100. The voltage generator 122 operates in response to the control of the control logic 130.

As an example, the voltage generator 122 may generate an internal power voltage by regulating the external power voltage. The internal power voltage generated by the voltage generator 122 is used as an operation voltage of the memory device 100.

In an embodiment, the voltage generator 122 may generate the plurality of operation voltages Vop using the external power voltage or the internal power voltage. The voltage generator 122 may be configured to generate various voltages required by the memory device 100. For example, the voltage generator 122 may generate a plurality of erase voltages, a plurality of program voltages, a plurality of pass voltages, a plurality of selection read voltages, and a plurality of non-selection read voltages.

In order to generate the plurality of operation voltages Vop having various voltage levels, the voltage generator 122 may include a plurality of pumping capacitors that receive the internal voltage and selectively activate the plurality of pumping capacitors to generate the plurality of operation voltages Vop.

The plurality of generated operation voltages Vop may be supplied to the memory cell array 110 by the address decoder 121.

The read and write circuit 123 includes first to m-th page buffers PB1 to PBm. The first to m-th page buffers PB1 to PBm are connected to the memory cell array 110 through first to m-th bit lines BL1 to BLm, respectively. The first to m-th page buffers PB1 to PBm operate in response to the control of the control logic 130.

The first to m-th page buffers PB1 to PBm communicate data with the data input/output circuit 124. At a time of program, the first to m-th page buffers PB1 to PBm receive the data DATA to be stored through the data input/output circuit 124 and data lines DL.

During the program operation, when a program pulse is applied to the selected word line, the first to m-th page buffers PB1 to PBm may transfer the data DATA to be stored, that is, the data DATA received through the data input/output circuit 124 to the selected memory cells through the bit lines BL1 to BLm. The memory cells of the selected page are programmed according to the transferred data DATA. A memory cell connected to a bit line to which a program permission voltage (for example, a ground voltage) is applied may have an increased threshold voltage. A threshold voltage of a memory cell connected to a bit line to which a program inhibition voltage (for example, a power voltage) is applied may be maintained. During the program verify operation, the first to m-th page buffers PB1 to PBm read the data DATA stored in the memory cells from the selected memory cells through the bit lines BL1 to BLm.

During the read operation, the read and write circuit 123 may read the data DATA from the memory cells of the selected page through the bit lines BL and store the read data DATA in the first to m-th page buffers PB1 to PBm.

During the erase operation, the read and write circuit 123 may float the bit lines BL. In an embodiment, the read and write circuit 123 may include a column selection circuit.

The data input/output circuit 124 is connected to the first to m-th page buffers PB1 to PBm through the data lines DL. The data input/output circuit 124 operates in response to the control of the control logic 130.

The data input/output circuit 124 may include a plurality of input/output buffers (not shown) that receive input data DATA. During the program operation, the data input/output circuit 124 receives the data DATA to be stored from an external controller (not shown). During the read operation, the data input/output circuit 124 outputs the data DATA transferred from the first to m-th page buffers PB1 to PBm included in the read and write circuit 123 to the external controller.

During the read operation or the verify operation, the sensing circuit 125 may generate a reference current in response to a signal of a permission bit VRYBIT generated by the control logic 130 and may compare a sensing voltage VPB received from the read and write circuit 123 with a reference voltage generated by the reference current to output a pass signal or a fail signal to the control logic 130.

The control logic 130 may be connected to the address decoder 121, the voltage generator 122, the read and write circuit 123, the data input/output circuit 124, and the sensing circuit 125. The control logic 130 may be configured to control all operations of the memory device 100. The control logic 130 may operate in response to a command CMD transferred from an external device.

The control logic 130 may generate various signals in response to the command CMD and the address ADDR to control the peripheral circuit 120. For example, the control logic 130 may generate an operation signal OPSIG, the row address RADD, a read and write circuit control signal PBSIGNALS, and the permission bit VRYBIT in response to the command CMD and the address ADDR. The control logic 130 may output the operation signal OPSIG to the voltage generator 122, output the row address RADD to the address decoder 121, output the read and write control signal PBSIGNALS to the read and write circuit 123, and output the permission bit VRYBIT to the sensing circuit 125. In addition, the control logic 130 may determine whether the verify operation is a pass or failed in response to the pass or fail signal PASS/FAIL output by the sensing circuit 125.

Figure 4:
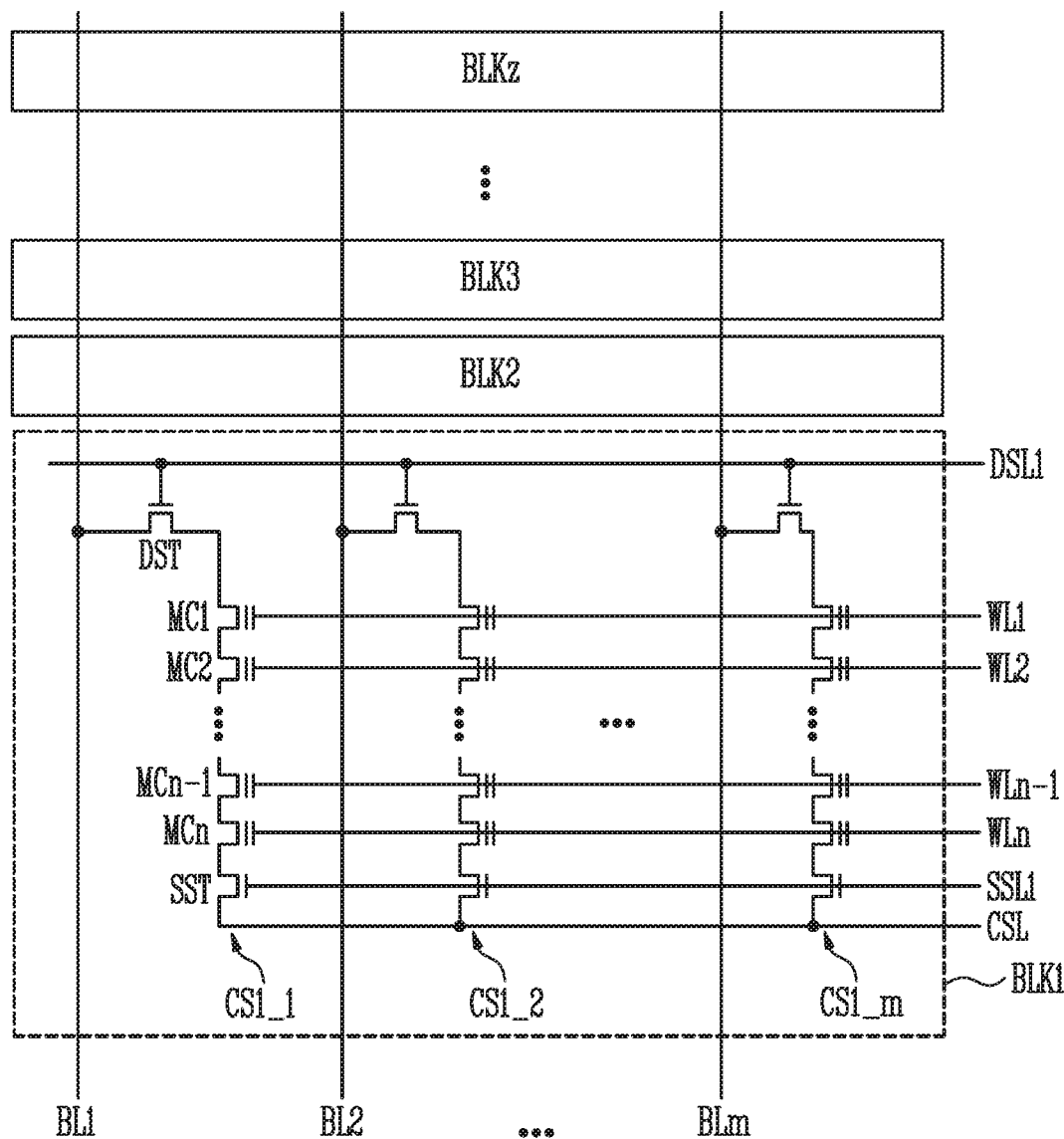
FIG. 4 is a diagram describing a memory cell array 110 of FIG. 3 including a plurality of memory blocks.

FIG. 4 is a diagram describing the memory cell array 110 of FIG. 3.

Referring to FIG. 4, the first to z-th memory blocks BLK1 to BLKz are commonly connected to the first to m-th bit lines BL1 to BLm. In FIG. 4, for convenience of description, elements included in the first memory block BLK1 of the plurality of memory blocks BLK1 to BLKz are shown, and elements included in each of the remaining memory blocks BLK2 to BLKz are omitted. It will be understood that each of the remaining memory blocks BLK2 to BLKz is configured similarly to the first memory block BLK1.

The first memory block BLK1 may include a plurality of cell strings CS1_1 to CS1_m (m is a positive integer). The first to m-th cell strings CS1_1 to CS1_m are connected to the first to m-th bit lines BL1 to BLm, respectively. Each of the first to m-th cell strings CS1_1 to CS1_m includes a drain select transistor DST, a plurality of memory cells MC1 to MCn connected in series (n is a positive integer), and a source select transistor SST.

Gate terminals of the drain select transistors DST included in each of the first to m-th cell strings CS1_1 to CS1_m are connected to a drain select line DSL1. Gate terminals of the first to nth memory cells MC1 to MCn included in the first to m-th cell strings CS1_1 to CS1_m are connected to first to the n-th word lines WL1 to WLn, respectively. Gate terminals of the source select transistors SST included in the first to m-th cell strings CS1_1 to CS1_m are connected to a source select line SSL1.

For convenience of description, a structure of the cell string will be described with reference to the first cell string CS1_1 of the plurality of cell strings CS1_1 to CS1_m. However, it will be understood that each of the remaining cell strings CS1_2 to CS1_m is configured similarly to the first cell string CS1_1.

A drain terminal of the drain select transistor DST included in the first cell string CS1_1 is connected to the first bit line BL1. A source terminal of the drain select transistor DST included in the first cell string CS1_1 is connected to a drain terminal of the first memory cell MC1 included in the first cell string CS1_1. The first to n-th memory cells MC1 to MCn are connected in series with each other. A drain terminal of the source select transistor SST included in the first cell string CS1_1 is connected to a source terminal of the n-th memory cell MCn included in the first cell string CS1_1. A source terminal of the source select transistor SST included in the first cell string CS1_1 is connected to a common source line CSL. In an embodiment, the common source line CSL may be commonly connected to the first to z-th memory blocks BLK1 to BLKz.

The drain select line DSL1, the first to nth word lines WL1 to WLn, and the source select line SSL1 are included in row lines RL of FIG. 3. The drain select line DSL1, the first to nth word lines WL1 to WLn, and the source select line SSL1 are controlled by the address decoder 121. The common source line CSL is controlled by the control logic 130. The first to m-th bit lines BL1 to BLm are controlled by the read and write circuit 123.

Figure 5:
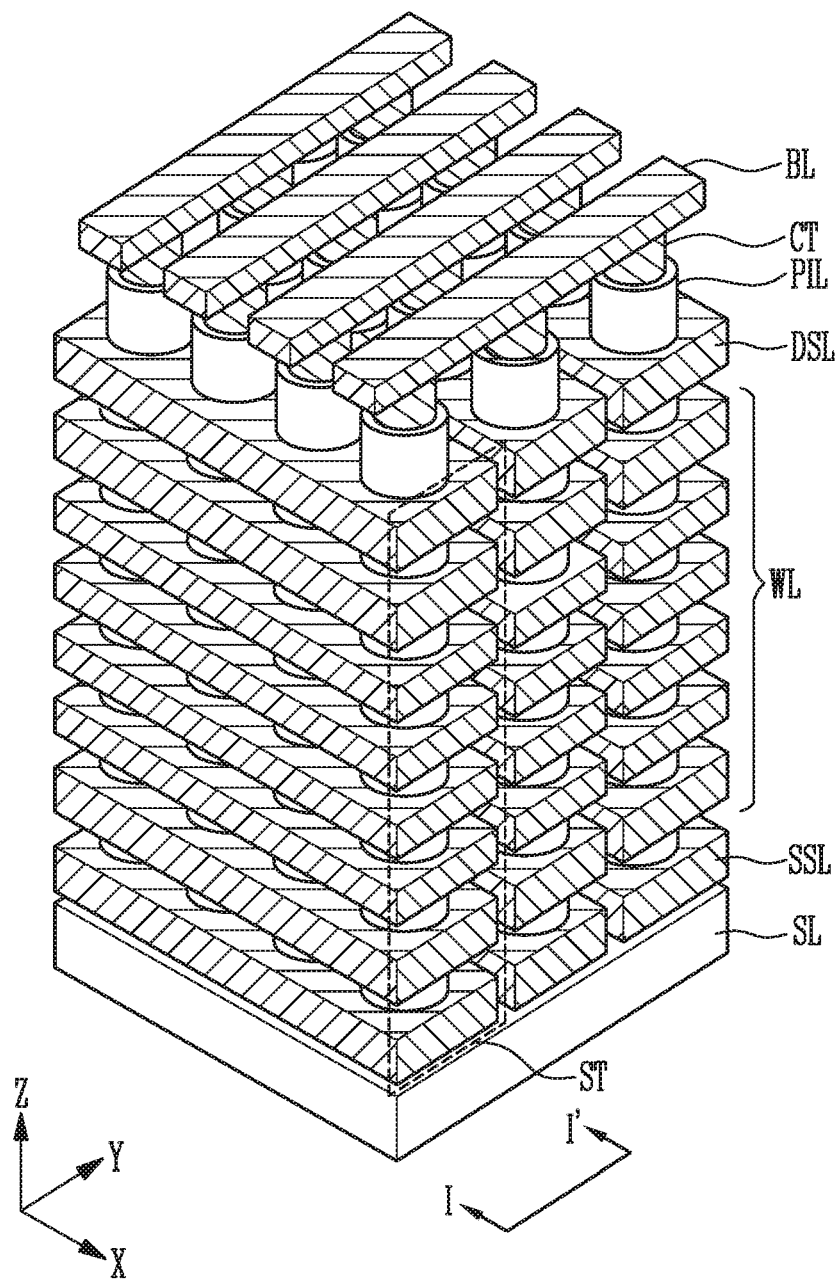
FIG. 5 is a perspective view describing a 3D memory block of the memory cell array of FIG. 4 according to an embodiment.

FIG. 5 is a perspective view describing a 3D memory block of the memory cell array of FIG. 4 according to an embodiment.

Referring to FIG. 5, a memory block implemented in a three-dimensional structure may be formed in a vertical (Z direction) I-shape on a substrate, and may include cell strings ST arranged between bit lines BL and a source line SL. Such a structure is also referred to as bit cost scalable (BiCS). For example, when the source line SL is formed horizontally to an upper portion of the substrate, the cell strings ST having the BiCS structure may be formed in a direction perpendicular to an upper portion of the source line SL. More specifically, the cell strings ST may include source select lines SSL, word lines WL, and drain select lines DSL arranged in a first direction (Y direction) and stacked apart from each other. The number of the source select lines SSL, the word lines WL, and the drain select lines DSL is not limited to the number shown in FIG. 5, and may vary according to the memory device.

The cell strings ST may include a pillar PIL that vertically penetrates the source select lines SSL, the word lines WL, and the drain select lines DSL. Bit lines BL are in contact with respective upper portions of the pillars PIL which are protruding to respective upper portions of the drain select lines DSL. The bit lines BL are arranged in a second direction (X direction) which is perpendicular to the first direction (Y direction).

The pillars PIL may include a vertical channel film and a memory film. For example, the memory film may be formed in a cylindrical shape along an inner side of a vertical hole vertically penetrating the source select lines SSL, the word lines WL, and the drain select lines DSL, and the vertical channel film of a cylindrical shape may be formed inside the memory film. When the vertical channel film is formed in the cylindrical shape, a vertical insulating film may be filled in the vertical channel film. The vertical channel film may be formed, for example, of a polysilicon film. The memory film may be formed in a cylindrical shape surrounding the vertical channel film, and may include a tunnel insulating film, a charge trap film, and a blocking film. Portions of the memory film that are in contact with the word lines WL may be the memory cells. In addition, a structure in which one cell string ST includes one pillar PIL is referred to as a single stack structure, and a structure in which a plurality of pillars are stacked is referred to as a multi-stack structure. A contact plug CT may further be formed between the bit lines BL and the pillars PIL.

Figures 6, 7:
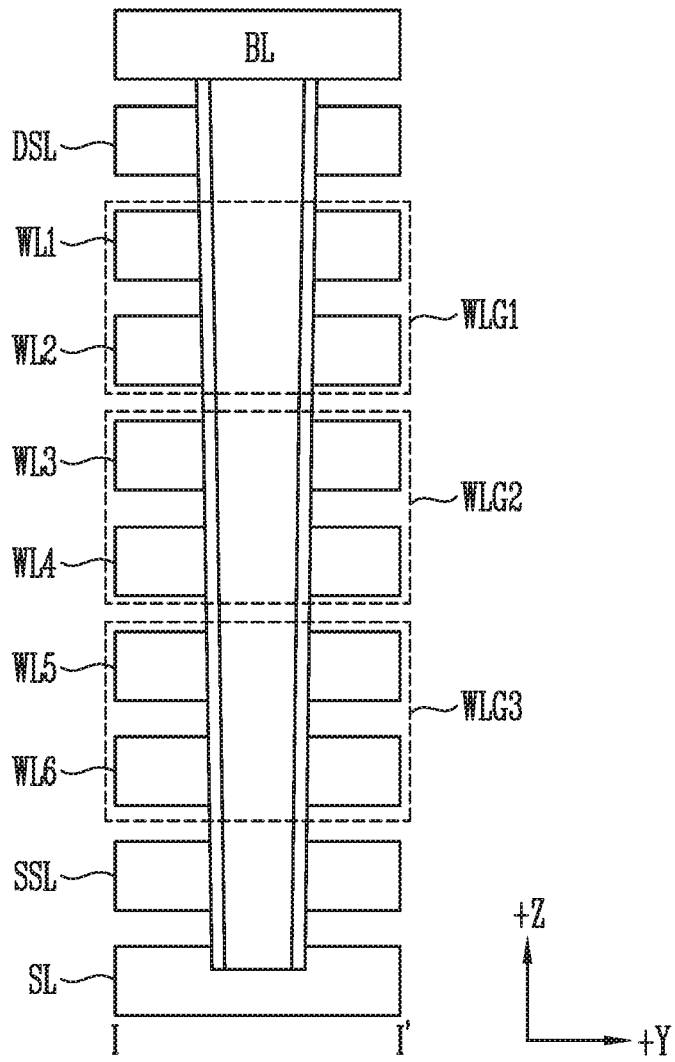
FIG. 6 is a diagram describing a cell string formed in a single stack structure.
FIG. 7 is a table describing an operation speed and offset of word line groups of FIG. 6.

FIG. 6 is a diagram describing a cell string formed in a single stack structure.

Referring to FIG. 6, the word lines WL1 to WL6 may be stacked between the source select line SSL and the bit line BL. FIG. 6 is a diagram for facilitating understanding of the present embodiment. The number of the lines SL, SSL, WL1 to WL6, DSL, and BL may vary according to the memory device. Due to a characteristic of a manufacturing process, a width of the pillar may become narrower from an upper portion to a lower portion. The narrower the width of the pillar where the word line is positioned, the higher the operation speed of the word line may be. For example, the operation speed of the word line may be higher from the first word line WL1 to the sixth word line WL6.

In various embodiments, the cell string may have a multi-stack structure in which a plurality of stacks are stacked. Even though the same program operation is performed, a difference of a threshold voltage may occur in the memory cells included in the cell string, according to the positions of the memory cells and a program order. In other words, the memory cells included in the cell string may have different operation speeds according to their positions.

In FIG. 6, the word lines WL1 to WL6 are shown as being divided into a plurality of word line groups WLG1 to WLG3. For example, the first and second word lines WL1 and WL2 may be defined as a first word line group WLG1 sequentially from an upper end. The third and fourth word lines WL3 and WL4 may be defined as a second word line group WLG2. The fifth and sixth word lines WL5 and WL6 may be defined as a third word line group WLG3. The number of the word line groups included in the single stack and the number of the word lines included in each word line group may vary and are not limited to the ones shown in FIG. 6. The number of the word lines included in each word line group may be the same. The number of the word lines included in each word line group may be different. The number of the word lines included in the word line groups may sequentially increase or decrease according to the position of the word line group in the stack structure.

The operation speed of the word line group may be determined based on a program operation speed or an erase operation speed for a test word line included in the word line group. The test word line may be variously selected according to the operation speed or the position of the word line among the word lines included in the word line group. For example, the test word line may be the lowest word line in each word line group. As another example, the test word line may be a word line with a highest operation speed in each word line group.

In FIG. 6, the test word line of the first word line group WLG1 may be the second word line WL2. The test word line of the second word line group WLG2 may be the fourth word line WL4. The test word line of the third word line group WLG3 may be the sixth word line WL6.

The number of the test word lines included in each of the word line groups is not limited to one as described in the present embodiment of FIG. 6. When the word line group includes a plurality of test word lines, the operation speed of the word line group may be the highest value, the lowest value, an intermediate value, or an average value of the operation speed of the plurality of test word lines.

FIG. 7 is a table describing the operation speed and offset of the word line groups of FIG. 6.

Referring to FIGS. 6 and 7, the first word line group WLG1 may be positioned at an upper end of the single stack in which the width of the pillar is the widest. The second word line group WLG2 may be positioned at a middle end of the single stack in which the width of the pillar is medium. The third word line group WLG3 may be positioned at a lower end of the single stack in which the width of the pillar is the narrowest. The operation speed of each word line group may vary according to the position of the word line group.

Since the width of the pillar becomes narrower from the first word line group WLG1 to the third word line group WLG3, the operation speed of the word line group may be higher from the first word line group WLG1 to the third word line group WLG3. In other words, the third word line group WLG3 may have a higher operation speed than the first word line group WLG1.

For example, when the same program operation is performed on the first word line group WLG1 which is positioned at a portion of the pillar having the widest width of the pillar and the third word line group WLG3 which is positioned at a portion of the pillar having the narrowest width of the pillar, the program operation for the third word line WLG3 may be completed before the program operation for the first word line group WLG1 completed.

To equalize the operation speed of each word line group, different offsets may be added to the program bias applied to the word line group during the program operation, according to the operation speed of the word line group.

Specifically, the offset of the word line groups may be determined based on a reference operation speed and the operation speed of each word line group. The reference operation speed may include the operation speed of the selected die, the highest speed, the lowest speed, the average speed, and the middle speed among the operation speeds of each of the plurality of word line groups. A value of the offset may have a positive value, 0, or a negative value according to the reference operation speed.

In other words, since the larger the program bias applied to the word line group, the higher the operation speed of the program, the offset applied to the word line group of which the operation speed is low may be larger than the offset applied to the word line group of which the operation speed is high.

In FIG. 7, since the operation speed of the word line group becomes higher from the first word line group WLG1 to the third word line group WLG3, a magnitude of the offset corresponding to the word line group may be reduced from the first word line group WLG1 to the third word line group WLG3. That is, the magnitude of the offset may be larger in order of the first offset Offset 1, the second offset Offset 2, and the third offset Offset 3. For example, the first offset Offset 1 may be small, the second offset Offset 2 may be medium, and the third offset Offset 3 may be large.

For all memory blocks included in one memory die, the offset of the word line group at the same position in the memory block may be equally set. For example, the offset of the first word line group of the first memory block may be set equally to the offset of the first word line group of the second memory block.

Figure 8:
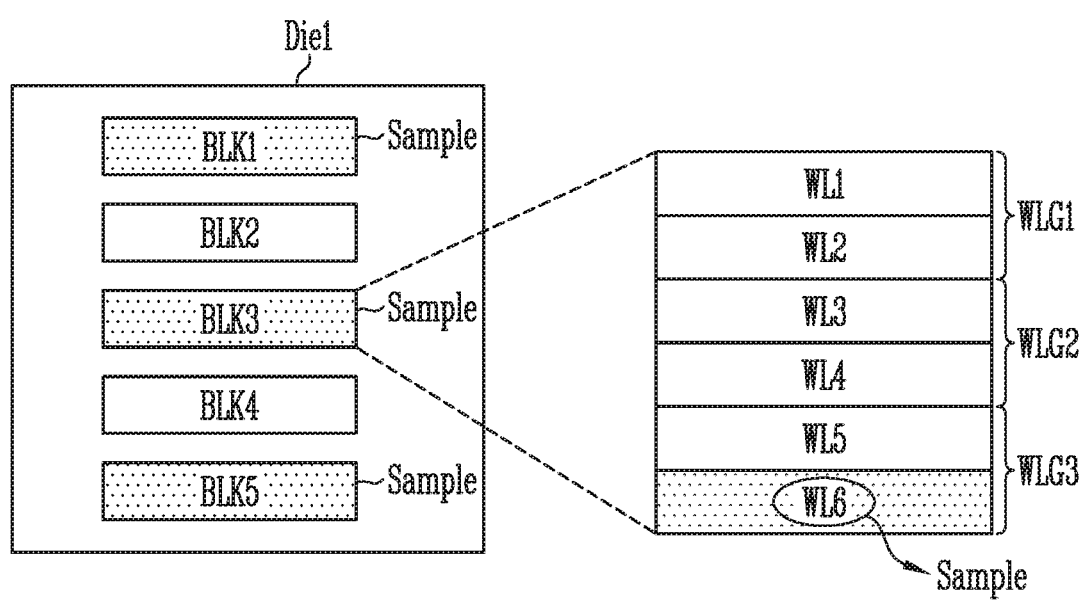
FIG. 8 is a diagram describing a sample block and a sample word line according to an embodiment.

FIG. 8 is a diagram describing a sample block and a sample word line according to an embodiment.

Referring to FIG. 8, the memory die may include at least one sample block. The at least one sample block may include at least one sample word line.

The operation speed of the memory die may be determined based on an operation speed of the at least one sample block. The operation speed of the at least one sample block may be determined based on the program operation speed or the erase operation speed for the at least one sample word line. More than one sample blocks may be variously selected according to the operation speed or the position of the memory block among the plurality of memory blocks included in the memory die. In an embodiment, the operation speed of the memory die may be an average value of the operation speed of the sample blocks. In various embodiments, the operation speed of the memory die may be the highest value, the lowest value, or an intermediate value of the operation speed of the sample blocks.

In FIG. 8, a first memory die Die1 may include first to fifth memory blocks BLK1 to BLK5. Each memory block may include first to sixth word lines WL1 to WL6. The number of the memory blocks included in the memory die and the number of the word lines included in the memory block are not limited to the ones described in the present embodiment of FIG. 8. In the example of FIG. 8, the first, third, and fifth memory blocks BLK1, BLK3, and BLK5 may be sample blocks and the operation speed of the first memory die Die1 may be determined as an average value of the operation speeds of the sample blocks BLK1, BLK3, and BLK5.

The operation speed of each of the sample blocks BLK1, BLK3, and BLK5 may be determined based on the operation speed of the sample word line included in each sample block. The sample word line may be a word line of which the operation speed is the highest among the plurality of word lines included in the sample block. In various embodiments, when the sample block includes a plurality of sample word lines, the operation speed of the sample block may be the highest value, the lowest value, an intermediate value, or an average value of the operation speeds of the plurality of sample word lines.

In the example of FIG. 8, it is illustrated as an example that the operation speed of the sample block BLK3 may be determined based on the operation speed of the sixth word line WL6, which is the sample word line. The sixth word line WL6 may be the word line of which the operation speed is the highest among the word lines WL1 to WL6 included in the sample block BLK3.

Figure 9:
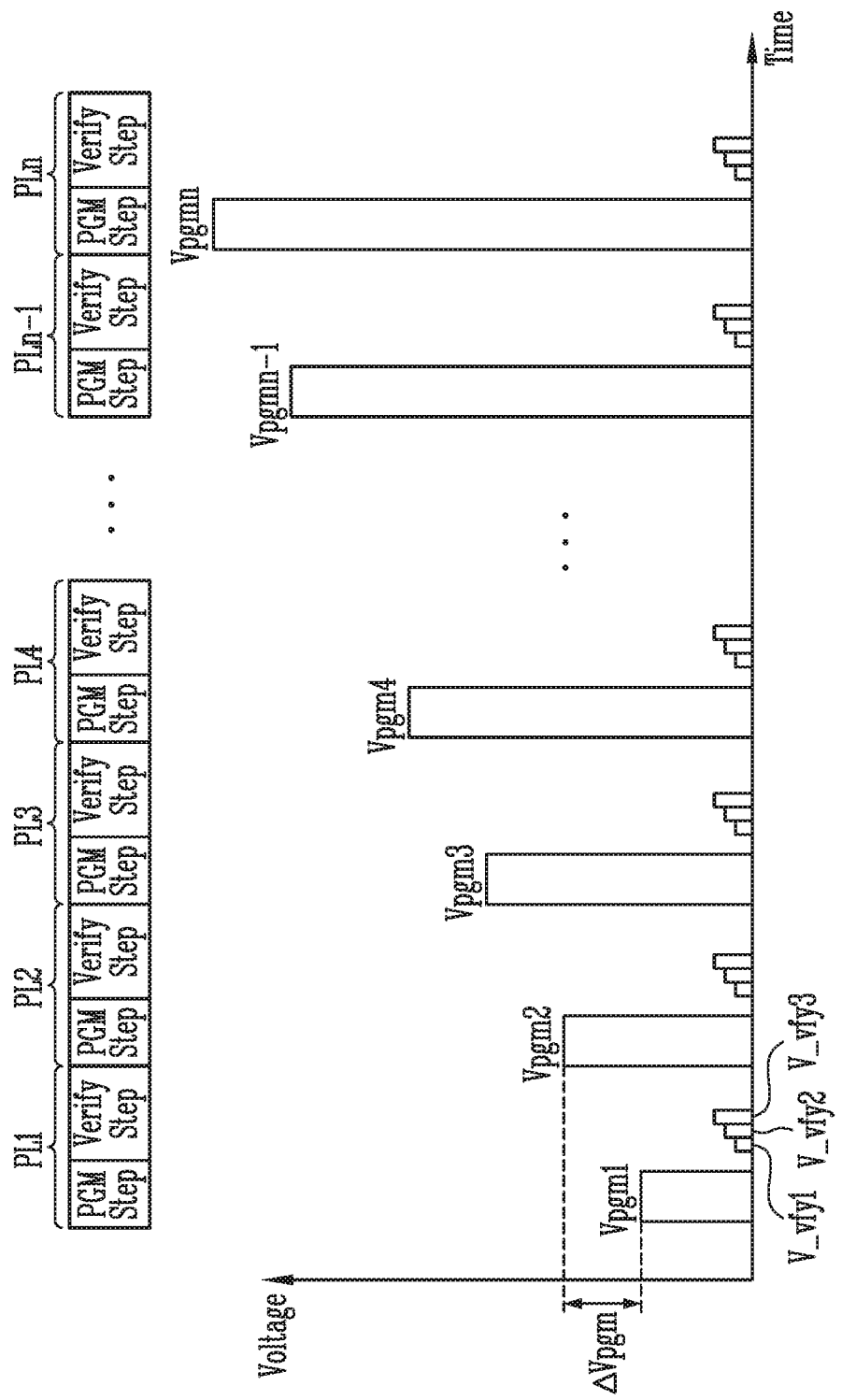
FIG. 9 is a diagram describing a program operation according to an embodiment.

FIG. 9 is a diagram describing a program operation according to an embodiment.

Referring to FIG. 9, a program operation may include a plurality of program loops PL1 to PLn, each program loop including a program step PGM Step and a verification step Verify Step. When the memory cell is a multi-level cell storing two data bits, the memory device described with reference to FIG. 3 may perform a program so that memory cells selected by performing a plurality of program loops PL1 to PLn have any one of a plurality of program states P1, P2, and P3. It is noted, however, that the memory cell may be different level cell capable of storing a different number of data bits.

Each of the plurality of program loops PL1 to PLn may include a verify step of a program voltage applying step (PGM step) of applying a program pulse and a verify step of determining whether the memory cells are programmed by applying verify voltages.

For example, when the first program loop PL1 is performed, first to third verify voltages V_vfy1 to V_vfy3 are sequentially applied in order to verify the program state of the plurality of memory cells after a first program pulse Vpgm1 is applied. At this time, memory cells of which a target state is the first program state P1 may be verified by the first verify voltage V_vfy1, memory cells of which the target state is the second program state P2 may be verified by the second verify voltage V_vfy2, and memory cells of which the target state is the third program state P3 may be verified by the third verify voltage V_vfy3.

The memory cells that are verify-passed by the respective verify voltages V_vfy1 to V_vfy3 are determined to have the target state and then program-inhibited in the second program loop PL2. In order to program the remaining memory cells other than the program-inhibited memory cell in the second program loop PL2, a second program pulse Vpgm2 higher than the first program pulse Vpgm1 by a unit voltage ΔVpgm is applied. Thereafter, the verify operation is performed equally to the verify operation of the first program loop PL1. As an example, a verify pass indicates that the memory cell is read as an off-cell by a corresponding verify voltage.

As described above, when the memory device programs a multi-level cell (MLC) storing two data bits, the memory device uses the first to third verify voltages V_vfy1 to V_vfy3 to verify the respective memory cells of which the respective program states is the target state.

In the verify step, a verify voltage may be applied to the selected word line, which is the word line to which the selected memory cells are connected, and the page buffer may determine whether or not the memory cells are verify-passed based on a current or a voltage flowing through the bit lines connected to the selected memory cells.

Figure 10:
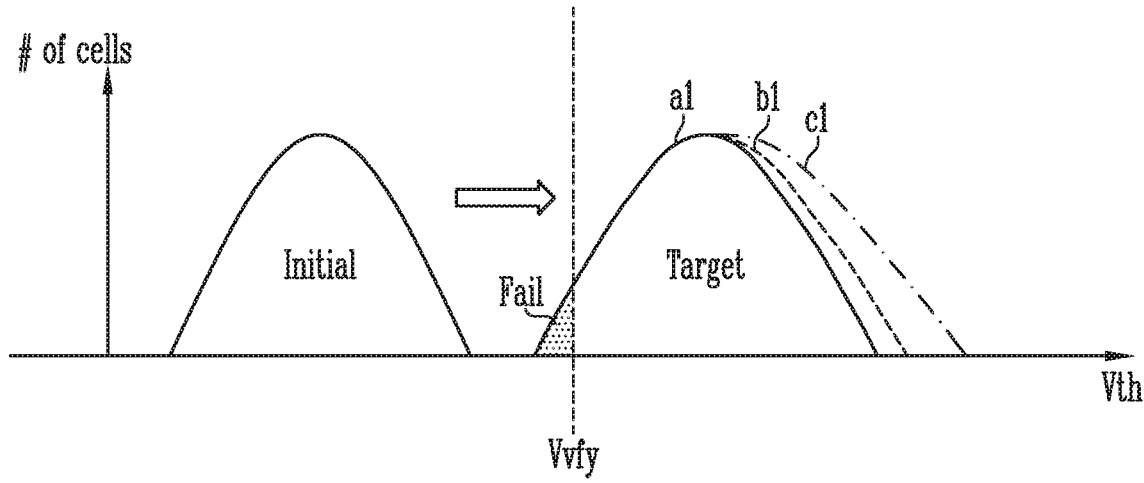
FIG. 10 is a diagram of threshold voltage distributions describing a first embodiment in which an operation speed is measured.

FIG. 10 is a diagram describing a first embodiment in which an operation speed is measured.

In FIG. 10, the horizontal axis represents a threshold voltage of the memory cell, and the vertical axis represents the number of the memory cells. In order to measure the operation speed of the selected word line, a program operation may be performed on the selected memory cells connected to the selected word line. Selected memory cells having an initial state may be programmed to have a target state.

When the verify operation for a result of performing the program operation is a pass, the program operation may be successful, and when the verify operation is a fail, the program operation may be determined to have failed. For example, when the number of memory cells having a threshold voltage lower than the verify voltage Vvfy is equal to or less than a reference number among the selected memory cells, the verify operation may be considered to have passed or simply stated be a pass. When the number of the memory cells having the threshold voltage lower than the verify voltage Vvfy is greater than the reference number among the selected memory cells, the verify operation may be considered to have failed or simply stated be a fail.

In other words, the pass or fail of the verify operation may be determined according to a result of comparison between the number of fail bits included in read data and the reference number by applying the verify voltage to the selected word line. When the number of fail bits is equal to or less than the reference number, the verify operation may be a pass, and when the number of the fail bits is greater than the reference number, the verify operation may be a fail. The number of the fail bits may be the number of memory cells to be read as the on-cell by the verify voltage Vvfy among the selected memory cells. The reference number may be the number of error bits that may be corrected by an error correction circuit.

When the verify operation is a fail, a program pulse of higher level may be applied to the selected word line and the program operation may be performed in an incremental step pulse programming (ISPP) method until the verify operation is a pass.

The operation speed of the selected word line may be determined based on the number of times the program pulses are applied to the selected word line until the program operation for the selected word line is successful.

As the number of the program pulses applied to the selected word line until the program operation is successful is low, the memory cells connected to the selected word line may be memory cells of which a threshold voltage is rapidly increased. As the number of the program pulses applied to the selected word line until the program operation is successful is high, the memory cells connected to the selected word line may be memory cells of which a threshold voltage is slowly increased. That is, it may be determined that when the number of the program pulses applied to the selected word line until the program operation is successful is high, the operation speed of the selected word line is high, and when the number of the program pulses applied to the selected word line until the program operation is successful is low, the operation speed of the selected word line is low.

For example, the first to third word lines may be word lines to which the program pulse is applied until memory cells connected to each word line succeed in a programming operation from an initial state to a target state.

For example, the number of the program pulses applied to the first word line may be 12, the number of the program pulses applied to the second word line may be 10, and the number of the program pulses applied to the third word line may be 9. The number of the program pulses applied to each word line until the program operation is successful is not limited to the present embodiment.

In other words, the number of the program pulses applied to the first word line may be the greatest, the number of the program pulses applied to the second word line may be medium, and the number of the program pulses applied to the third word line may be the smallest. Therefore, the operation speed of the word line may decrease from the third word line, to the first word line. In other words, the third word line may have the highest operation speed, the second word line may have a medium operation speed, and the first word line may have the lowest operation speed.

As the word line is operated at a high speed, the threshold voltage of the memory cell connected to the word line may be rapidly increased during the program operation. Therefore, the number of memory cells distributed in a right tail of the word line having a high operation speed may be larger than that of the word line having a slow operation speed, when the program operation is successful.

In FIG. 10, a1 may be the threshold voltage distribution of the memory cells connected to the first word line, b1 may be the threshold voltage distribution of the memory cells connected to the second word line, and c1 may be the threshold voltage distribution of the memory cells connected to the third word line.

Since the operation speed of the third word line is the highest, the number of the memory cells distributed in the right tail may be the largest when the program operation is successful. Since the operation speed of the second word line is medium, the number of the memory cells distributed in the right tail may be medium when the program operation is successful. Since the operation speed of the first word line is the lowest, the number of the memory cells distributed in the right tail may be the smallest when the program operation is successful.

The operation speed of the sample word line and the operation speed of the test word line may be measured in the method described with reference to FIG. 10.

Figure 11:
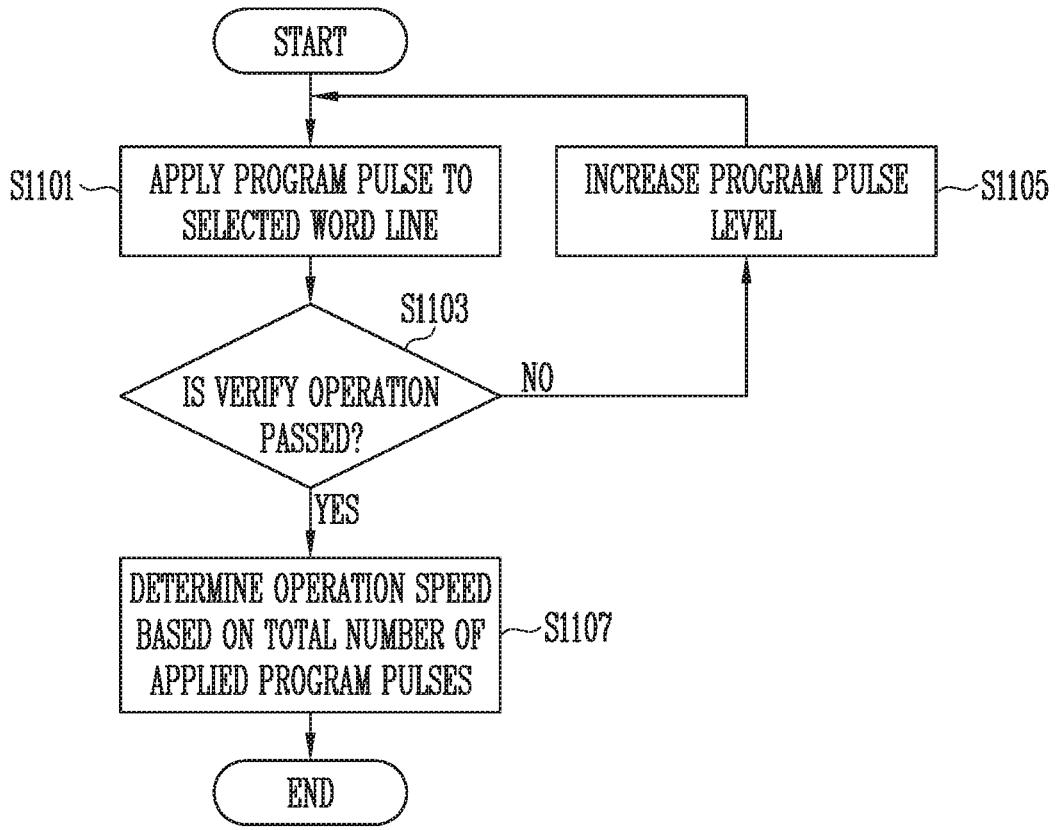
FIG. 11 is a flowchart describing an operation speed measuring method according to the first embodiment.

FIG. 11 is a flowchart describing an operation speed measuring method according to a first embodiment.

Referring to FIG. 11, in step S1101, a program pulse may be applied to a selected word line.

In step S1103, it may be determined whether the verify operation for the selected word line is a pass or a fail. When the number of the memory cells having the threshold voltage lower than the verify voltage among the memory cells connected to the selected word line is equal to or less than the reference number, the verify operation may be a pass. When the number of the memory cells having the threshold voltage lower than the verify voltage among the memory cells connected to the selected word line is greater than the reference number, the verify operation may be a fail.

As a result of the determination, when the verification operation is a pass ('Yes' in step S1103), the process proceeds to step S1107, and when the verification operation is a fail ('No' in step S1103), the process proceeds to step S1105.

In step S1105, a program pulse level to be applied to the selected word line may be increased. For example, the program pulse level to be applied to the selected word line may be increased according to the ISPP method.

In step S1107, the operation speed of the selected word line may be determined based on a total number of the program pulses applied to the selected word line.

Figure 12:
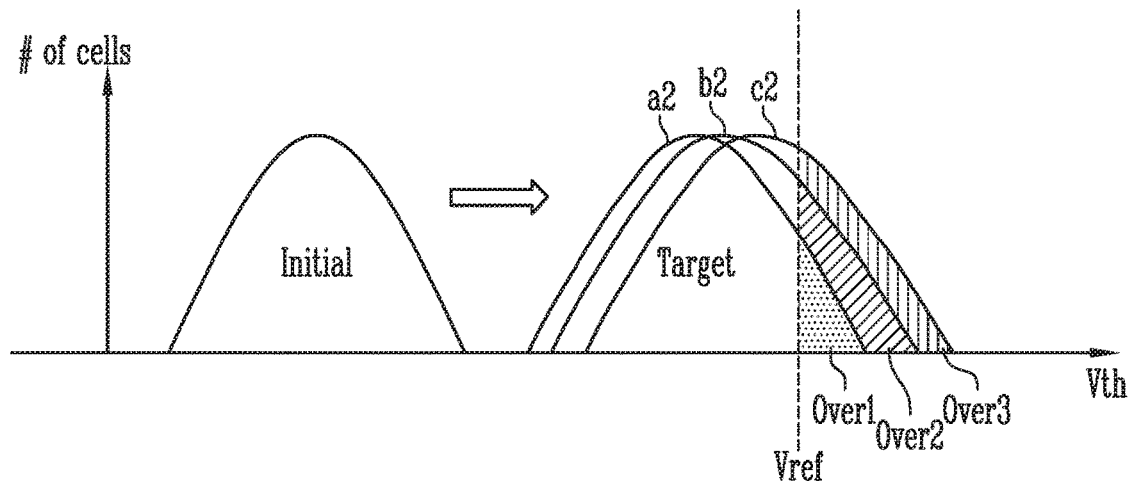
FIG. 12 is a diagram of threshold voltage distributions describing a second embodiment in which an operation speed is measured.

FIG. 12 is a diagram describing a second embodiment in which the operation speed is measured.

Referring to FIG. 12, a horizontal axis represents a threshold voltage of the memory cell, and a vertical axis represents the number of the memory cells. In order to measure the operation speed of the selected word line, a program operation may be performed on the selected memory cells connected to the selected word line. Selected memory cells having an initial state may be programmed to have a target state.

The operation speed of the selected word line may be determined based on the number of memory cells having a threshold voltage higher than the reference voltage after applying a set number of program pulses to the selected word line. As the number of the memory cells having the threshold voltage higher than the reference voltage is high, a threshold voltage increases speed of the memory cells connected to the selected word line may be high.

In FIG. 12, a2 may be a threshold voltage distribution of the memory cells connected to the first word line after applying a set number of program pulses, b2 may be the threshold voltage distribution of the memory cells connected to the second word line after the set number of program pulses are applied, and c2 may be the threshold voltage distribution of the memory cells connected to the third word line after the set number of program pulses are applied.

The memory cells having a threshold voltage higher than the reference voltage Vref among the memory cells connected to the first word line may be memory cells belonging to an Over1 region. The memory cells having a threshold voltage higher than the reference voltage Vref among the memory cells connected to the second word line may be memory cells belonging to the Over1 region and Over2 region. The memory cells having a threshold voltage higher than the reference voltage Vref among the memory cells connected to the third word line may be memory cells belonging to the Over1 region, Over2 region, and Over3 region.

Therefore, since the number of the memory cells having a threshold voltage higher than the reference voltage Vref is highest in the third word line, intermediate in the second word line, and lowest in the first word line after application of the set number of program pulses, the operation speed may be highest in the third word line, intermediate in the second word line, and lowest in the first word line.

The operation speed of the sample word line and the operation speed of the test word line may be measured in the method described with reference to FIG. 12.

Figure 13:
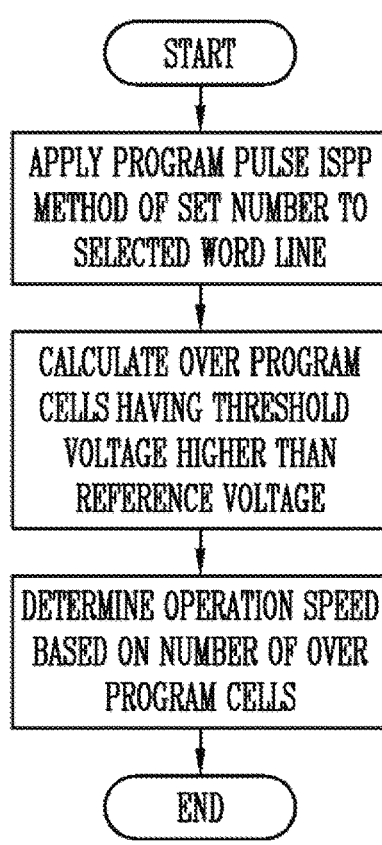
FIG. 13 is a flowchart describing an operation speed measuring method according to the second embodiment.

FIG. 13 is a flowchart describing an operation speed measuring method according to the second embodiment.

Referring to FIG. 13, in step S1301, a set number of program pulses may be applied to the selected word line in the ISPP method. As the number of the application times increases, the level of the program pulse applied to the selected word line may increase.

In step S1303, the number of over program cells having a threshold voltage higher than the reference voltage among the memory cells connected to the selected word line may be calculated.

In step S1305, the operation speed of the selected word line may be determined based on the number of the over program cells.

Figures 14, 15:
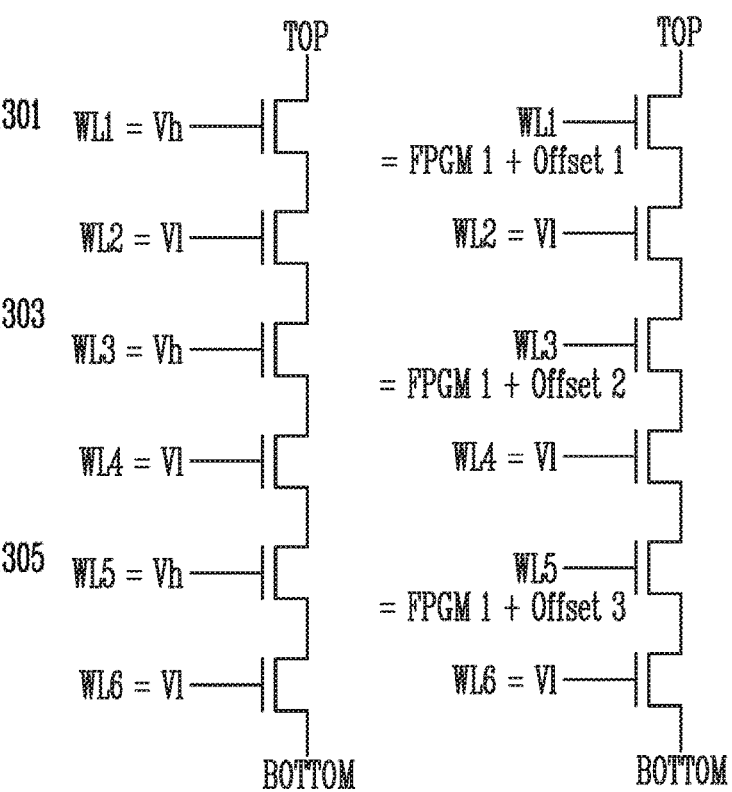
FIG. 14 is a diagram describing a word line stress application operation according to an embodiment.
FIG. 15 is a diagram describing a word line stress application operation according to another embodiment.

FIG. 14 is a diagram describing a word line stress application operation according to an embodiment.

Referring to FIG. 14, memory cells included in a memory cell string may be connected to a plurality of word lines WL1 to WL6. The number of the memory cell strings connected to the word lines and the number of the word lines are not limited to the present embodiment.

The word line stress application operation may include alternately applying a high voltage Vh and a low voltage Vl to the word lines. Specifically, the word line stress application operation may apply the high voltage Vh to any one of the odd word lines or the even word lines and applying the low voltage Vl to the remaining word lines.

In FIG. 14, as an example, it is illustrated that during the word line stress application operation, the high voltage Vh is applied to the odd word lines WL1, WL3, and WL5 and the low voltage Vl is applied to the even word lines WL2, WL4, and WL6.

When the high voltage Vh is applied to one word line of two adjacent word lines and the low voltage Vl is applied to the other word line of the two adjacent word lines, the two word lines are stressed due to a potential difference between two ends. When artificially stressing the word lines, a short may occur between adjacent word lines. Weak word lines having defect may be detected in advance by artificially stressing the word lines as described above. A memory block including a weak word line may be processed as a bad block.

Specifically, a program operation of storing original data in the selected memory cells may be performed after the word line stress application operation is performed. Thereafter, it may be determined whether or not the word line is defective according to a result of comparison between data read from the selected memory cells and the original data.

As the result of the comparison between the read data and the original data, when the number of fail bits is equal to or less than a predetermined number, the word line connected to the selected memory cells may be determined as a normal word line. As the result of the comparison between the read data and the original data, when the number of fail bits is greater than the predetermined number, the word line connected to the selected memory cells may be determined as a weak word line.

In another embodiment, it may be determined that the word line is defective according to a result of comparison between a leakage current of the word line and a reference value after the word line stress application operation is performed. When the leakage current of the selected word line is less than the reference value, the selected word line may be determined as the normal word line. When the leakage current of the selected word line is greater than the reference value, the selected word line may be determined as the weak word line.

FIG. 15 is a diagram describing a word line stress application operation according to another embodiment.

Referring to FIG. 15, different high voltages may be applied to the odd-numbered word lines WL1, WL3, and WL5 as compared with FIG. 14.

During the word line stress application operation, when the same high voltage is applied to the word lines, since the operation speed of the word lines is different for each word line, an amount of stress received by the word line may be different. For example, when the same high voltage is applied to the word lines, the word line having a high operation speed may receive a relatively excessive stress, and the word line having a low operation speed may receive a relatively small stress.

Therefore, in order to apply uniform stress to the word lines, a high voltage of an appropriate level is applied to each word line based on the operation speed of the word line. In order to apply the high voltage of the appropriate level to the word line, both the operation speed of the memory die and the operation speed of the word line group to which the word line belongs may be considered. The high voltage applied to the word line may have a value obtained by adding the program bias of the memory die including the word line and the offset corresponding to the word line group to which the word line belongs. The program bias of the memory die may be determined based on the operation speed of the memory die as described above with reference to FIG. 2, and the offset may be determined based on the operation speed of the word line group as described above with reference to FIG. 7.

Referring to FIGS. 1 and 2, the plurality of word lines WL1 to WL6 of FIG. 15 may be word lines included in the fifth memory die Die_5 having the highest operation speed among the plurality of memory dies Die_1 to Die_9. The program bias of the fifth memory die Die_5 may be the first program bias FPGM1.

Referring to FIGS. 6 and 7, the first and second word lines WL1 and WL2 may be the first word line group WLG1, the third and fourth word lines WL3 and WL4 may be the second word line group WLG2, and the fifth and sixth word lines WL5 and WL6 may be the third word line group WLG3. The first to third offsets Offset 1 to Offset 3 may be offsets corresponding to the first to third word line groups WLG1 to WLG3, respectively.

In FIG. 15, during the word line stress application operation, a predetermined or set low voltage Vl may be applied to the even word lines WL2, WL4, and WL6. The predetermined or set low voltage Vl may be a ground voltage. A plurality of high voltages may be applied to the odd word lines WL1, WL3, and WL5. The high voltage applied to the odd word lines may be different according to the operation speed of each odd word line.

For example, the high voltage applied to the first word line WL1 may be a value obtained by adding the first offset Offset 1 to the first program bias FPGM1. The high voltage applied to the third word line WL3 may be a value obtained by adding the second offset Offset 2 to the first program bias FPGM 1. The high voltage applied to the fifth word line WL5 may be a value obtained by adding the third offset Offset 3 to the first program bias FPGM 1.

In another embodiment, during the word line stress application operation, a predetermined or set low voltage Vl may be applied to the odd word lines WL1, WL3, and WL5. A plurality of high voltages may be applied to the even word lines WL2, WL4, and WL6 according to the operation speed of the word line.

FIG. 16 is a flowchart of a method for testing a memory device according to an embodiment.

Referring to FIG. 16, in step S1601, the program bias for each die may be determined. The program bias for each die may be determined based on the operation speed of each of the measured memory dies. The operation speed of each of the plurality of memory dies included in one wafer may be measured based on the operation speed of the plurality of sample blocks included in the memory die. The operation speed of the sample block may be determined based on the operation speed of the sample word line included in the sample block.

For example, the program bias of the selected memory die may be calculated by adding or subtracting a predetermined value to or from a default program bias according to the operation speed of the selected memory die.

In step S1603, an offset for each word line group may be determined based on the measured operation speed of the word line group. The operation speed of the word line group included in the selected block of the selected memory die may be measured based on the operation speed of the test word line included in the word line group. The offset may be variously set to compensate for a difference between the operation speed of the word line group and a reference operation speed. The reference operation speed may be the operation speed of the selected memory die.

In step S1605, different word line stresses may be applied according to the memory die and the word line group to which the word line belongs. Specifically, when the high voltage and the low voltage are alternately applied to the word lines, the high voltage may be a value obtained by adding the program bias of the memory die and the offset of the word line group including the word line to which the high voltage is applied. The program bias of the memory die may be determined based on the operation speed of the memory die (S1601), and the offset may be determined based on the operation speed of the word line group (S1603).

In step S1607, after the word line stress application operation (S1605) is performed, defect or not of the memory block may be determined through the test operation.

For example, when a leakage current of the word line is greater than the reference value, the memory block including a corresponding word line may be determined as a bad block.

In another embodiment, it may be determined whether the selected word line is a weak word line having a defect according to a result of comparison between the data read from the memory cells connected to the selected word line and the original data after performing the program operation of storing the original data in the memory cells connected to the selected word line. When, as the result of the comparison between the read data and the original data, the number of fail bits is greater than the reference number the selected word line may be determined as the weak word line. The memory block including the weak word line may be determined as a bad block.

What is claimed is:

1. A method of operating a memory device, the method comprising:
    setting a plurality of program biases corresponding to a plurality of memory dies, respectively, based on an operation speed of each of the plurality of memory dies;
    setting a plurality of offsets corresponding to a plurality of word line groups, respectively, based on an operation speed of each of the plurality of word line groups included in a selected block of a selected memory die among the plurality of memory dies; and
    detecting a defect of a target block of the selected memory die using a plurality of high voltages and a set low voltage determined based on a program bias corresponding to the selected memory die and the plurality of offsets.

2. The method of claim 1, wherein the detecting comprises:
    applying the set low voltage to any one word lines of odd word lines and even word lines included in the target block and applying the plurality of high voltages to the other word lines; and
    determining whether the target block is a bad block or a normal block based on a result of performing a test operation on the target block.

3. The method of claim 2, wherein the applying comprises applying the set low voltage to the odd word lines and applying the plurality of high voltages to the even word lines according to word line groups to which the even word lines belong, respectively.

4. The method of claim 2, wherein the applying comprises applying the set low voltage to the even word lines and applying the plurality of high voltages to the odd word lines according to word line groups to which the odd word lines belong, respectively.

5. The method of claim 2, wherein the applying comprises applying a pair of voltages to a first word line and a second word line adjacent to each other among the word lines included in the target block.

6. The method of claim 5, wherein the pair of voltages includes any one high voltage among the plurality of high voltages and the set low voltage.

7. The method of claim 6, wherein the any one high voltage is a value obtained by adding a program bias corresponding to the selected memory die and an offset corresponding to a word line group including a word line to which any one high voltage is applied among the plurality of offsets.

8. The method of claim 6, wherein the set low voltage is a ground voltage.

9. The method of claim 2, wherein the determining of whether the target block is the bad block or the normal block is based on a leakage current of the word lines included in the target block.

10. The method of claim 2, wherein the determining comprises:
    programming original data in selected memory cells of the target block; and
    determining whether the target block is the bad block or the normal block based on a comparison between data read from the selected memory cells and the original data.

11. The method of claim 1, wherein the setting of the plurality of program biases comprises:
    performing a program operation on a sample word line of at least one sample block included in each of the plurality of memory dies;
    measuring an operation speed of the at least one say p block based on a result of performing the program operation;
    determining an operation speed of each of the plurality of memory dies based on the operation speed of the at least one sample block; and
    determining the plurality of program biases by adding or subtracting a set value to or from a default program bias based on the operation speed of each of the plurality of memory dies.

12. The method of claim 11, wherein the operation speed of each of the plurality of memory dies is an average value of the operation speed of the at least one sample block.

13. The method of claim 11, wherein the program operation is performed in an incremental step pulse program (ISPP) method.

14. The method of claim 11, wherein the operation speed of the at least one sample block is determined according to the number of times a program pulse is applied to the sample word line until a verify operation on a result of performing the program operation is a pass.

15. The method of claim 11, wherein the operation speed of the at least one sample block is determined according to the number of memory cells having a threshold voltage higher than a reference voltage among memory cells connected to the sample word line after applying a set number of program pulses to the sample word line.

16. The method of claim 1, wherein the determining the plurality of offsets comprises:
    performing a program operation on a test word line included in each of the plurality of word line groups;
    measuring an operation speed of each of the plurality of word line groups based on a result of performing the program operation; and
    determining the plurality of offsets based on the operation speed of each of the plurality of word line groups and a reference operation speed.

17. The method of claim 16, wherein the reference operation speed includes a maximum speed, a minimum speed, an average speed, and an intermediate speed of the operation speed of each of the plurality of word line groups and the operation speed of the selected memory die.

18. The method of claim 16, wherein the program operation is performed in an incremental step pulse program (ISPP) method.

19. The method of claim 16, wherein the operation speed of each of the plurality of word line groups is determined according to the number of times a program pulse is applied to the test word line until a verify operation on a result of performing the program operation is a pass.

20. The method of claim 16, wherein the operation speed of each of the plurality of word line groups is determined according to the number of memory cells having a threshold voltage higher than a reference voltage among memory cells connected to the test word line after applying a set number of program pulses to the test word line.

* * * * *